(12) United States Patent
Sullivan et al.

(10) Patent No.: US 6,181,285 B1
(45) Date of Patent: Jan. 30, 2001

(54) LOW-DISTORTION POSITIONING EQUIPMENT FOR ANTENNA RADIATION PATTERN MEASUREMENTS

(75) Inventors: Jonathan L. Sullivan; James Blake Winter, both of Lincoln, NE (US)

(73) Assignee: Centurion International, Inc., Lincoln, NE (US)

( * ) Notice: Under 35 U.S.C. 154(b), the term of this patent shall be extended for 0 days.

(21) Appl. No.: 09/577,315

(22) Filed: May 24, 2000

(51) Int. Cl.⁷ .................................................. G01R 29/08
(52) U.S. Cl. ......................... 343/703; 343/765; 342/360
(58) Field of Search .................................. 343/703, 765, 343/766, 878, 880, 881, 882; 342/360; H01Q 1/12; G01R 29/08

(56) References Cited

U.S. PATENT DOCUMENTS 4,968,983 * 11/1990 Maeda ................................... 343/703
5,001,494 * 3/1991 Dorman et al. ....................... 343/703
5,119,105 * 6/1992 Ngai et al. ............................ 343/703
5,300,939 * 4/1994 Maeda et al. ......................... 343/703
6,031,498 * 2/2000 Issler .................................... 343/703

* cited by examiner

*Primary Examiner*—Tho Phan
(74) *Attorney, Agent, or Firm*—Zarley, McKee, Thomte, Voorhees & Sease; Dennis L. Thomte

(57) ABSTRACT

An antenna positioner is provided for use in an anechoic chamber to enable the radiation pattern of an antenna under test to be measured. A vertically disposed and selectively rotatable azimuth rotator pedestal is positioned in the anechoic chamber and a support is mounted on the pedestal for rotation therewith. A roll-axis shaft is mounted on the support for rotatably supporting the antenna under test. The roll-axis shaft rotator is positioned outside the anechoic chamber and has a horizontally disposed and horizontally movable connecting rod which is selectively movable into the chamber for connection to the roll-axis shaft to incrementally rotate the roll-axis shaft and the antenna under test.

6 Claims, 6 Drawing Sheets

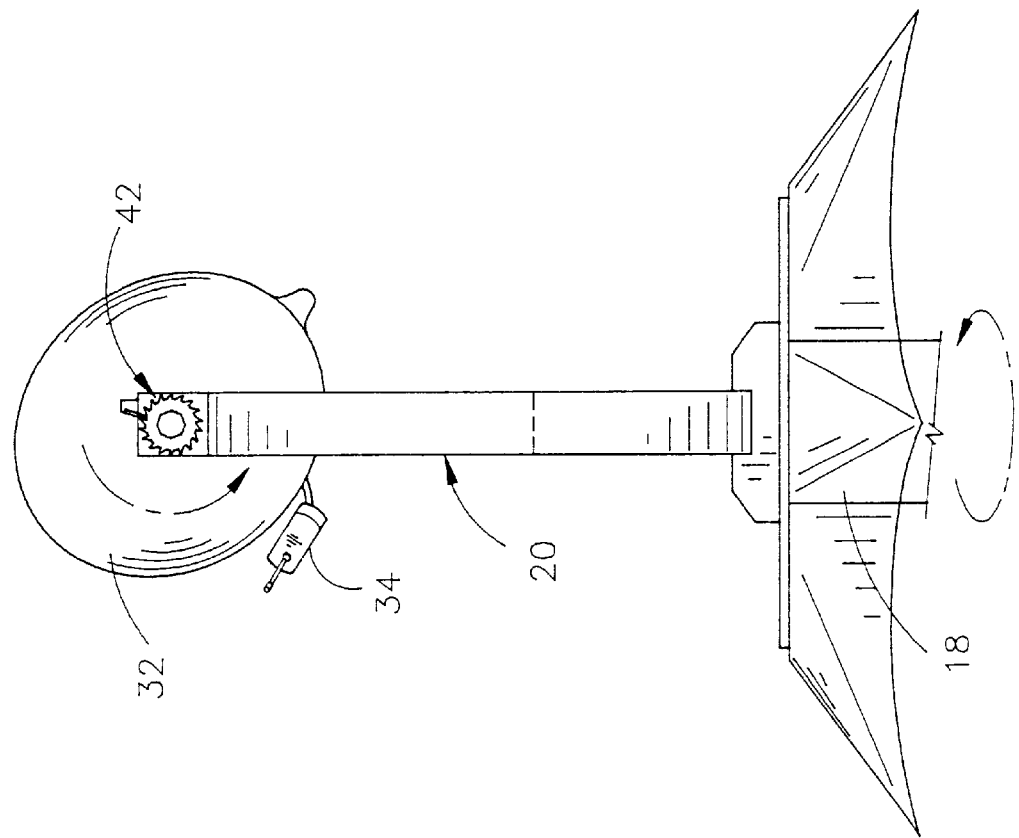
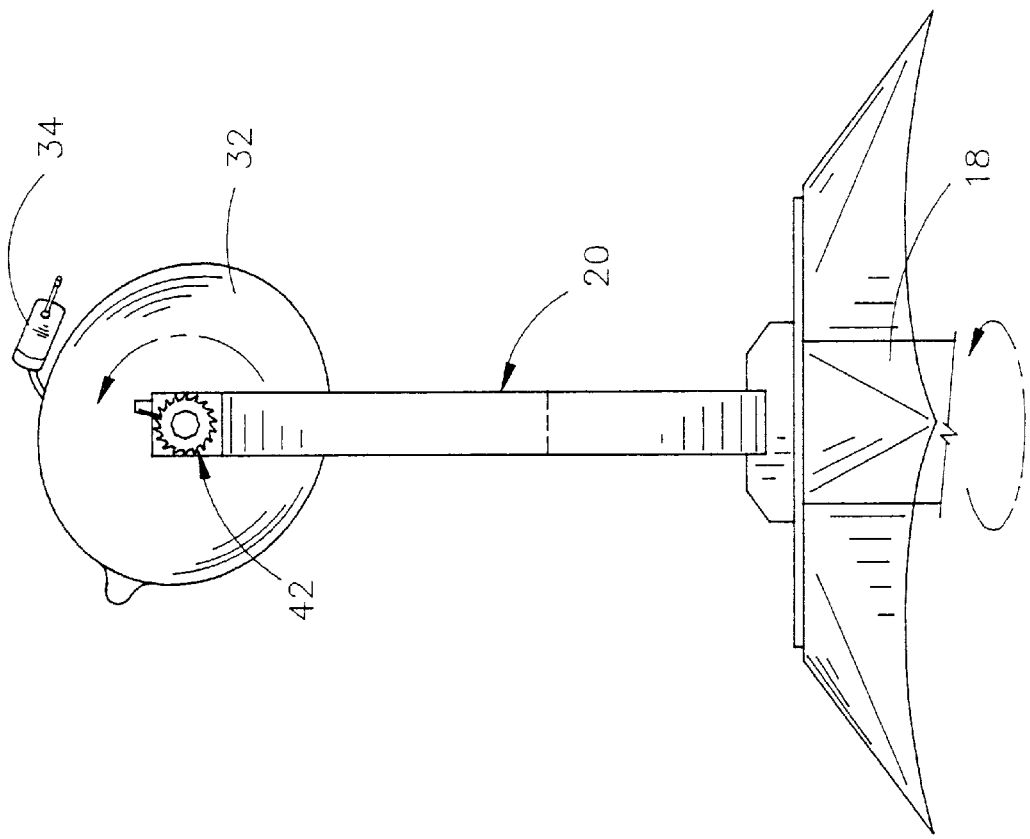

LOW-DISTORTION POSITIONING EQUIPMENT FOR ANTENNA RADIATION PATTERN MEASUREMENTS

BACKGROUND OF THE INVENTION

1. Field of the Invention

This invention relates to antenna radiation pattern measuring equipment and more particularly to low-distortion positioning equipment for antenna radiation pattern measurements.

2. Description of the Related Art

To completely characterize an antenna radiation pattern—especially for antennas having low gain and broad beamwidth—the gain must be measured over the entire $4\pi$ steradians solid angle. There are three ways to accomplish this goal. One way is to hold the antenna under test (AUT) in place and move the probe antenna along the surface of an imaginary sphere at a fixed radius from the AUT. The apparatus used to move the probe antenna is usually unwieldy and causes unwanted scattering which distorts the AUT radiation pattern.

A second way to accomplish the goal is to hold the probe antenna stationary and rotate the AUT such that the probe antenna appears to move along the imaginary sphere with respect to the AUT. The AUT orientation is changed at a fixed point thereby reducing the size and complexity of the positioning equipment compared to the first way. This is probably the most usual configuration. The positioning equipment once again causes undesired scattering that distorts the radiation pattern of the AUT.

The third way to accomplish the goal is to combine the previous two techniques. Usually the AUT is rotated azimuthally while the probe antenna is moved along an arc above the AUT. The concept is simpler than either of the two previous techniques, but the distortion caused by the positioning equipment is usually significant. To reduce the complexity of the arc and the azimuth rotator, the arc is usually incomplete—a portion of the radiation pattern is purposely excluded from the measurement. Depending on the shape of the radiation pattern, this can be a serious problem.

SUMMARY OF THE INVENTION

The present invention relates to a novel technique for measuring the radiation pattern of an antenna along the entire sphere of an AUT while causing a minimal amount of distortion. The present invention utilizes what is known as a roll-over-azimuth positioner. The roll-axis is incrementally changed between successive rotations of the azimuth positioner. Two unique aspects of the invention are responsible for minimizing the distortion. Instead of placing the roll-axis mechanism atop the azimuth rotator, as is usually the case, the rotation of the roll-axis is accomplished through a connecting rod that can be inserted through an opening made in the back wall of the anechoic chamber. The mechanism is placed on the slide in such a way that the rod can be moved into the chamber, connect to the roll-axis shaft, rotate the roll-axis shaft incrementally, and withdraw from the chamber. The roll-axis mechanism therefore does not cause reflections inside the anechoic chamber while the measurements are collected along the azimuth axis. The other unique aspect of the present invention is the use of low dielectric material to support the AUT and the roll-axis. The low dielectric material minimizes the distortion usually caused by the AUT support and the roll-axis support.

It is therefore a principal object of the invention to provide low-distortion positioning equipment for antenna radiation pattern measurements.

A further object of the invention is to provide equipment of the type described wherein the rotation of the roll-axis is accomplished through a connecting rod that may be inserted through an opening made in the back wall of an anechoic chamber.

Yet another object of the invention is to provide a roll-axis mechanism which does not cause reflections inside the anechoic chamber while the measurements are collected along the azimuth axis.

Still another object of the invention is to provide equipment of the type described which utilizes low dielectric material to support the antenna under test and the roll-axis.

These and other objects will be apparent to those skilled in the art.

BRIEF DESCRIPTION OF THE DRAWINGS

FIG. 3 is a view similar to FIG. 2 except that the antenna support has been incrementally rotated;

FIG. 4 is a view similar to FIG. 3 except that the antenna support has been further rotated;

DESCRIPTION OF THE PREFERRED EMBODIMENT

Figure 1:
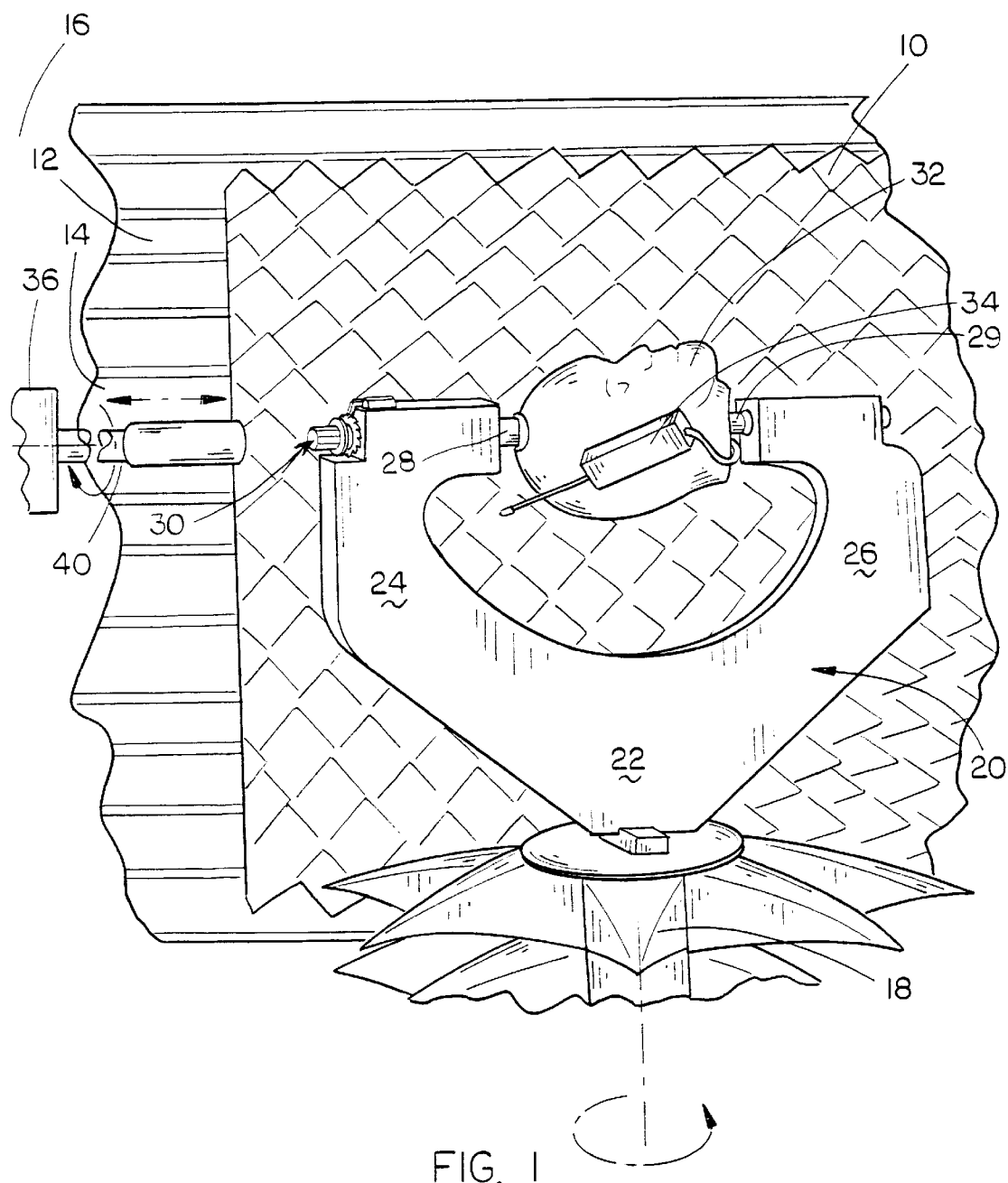
FIG. 1 is a partial perspective view illustrating the equipment of this invention.
Figure 2:
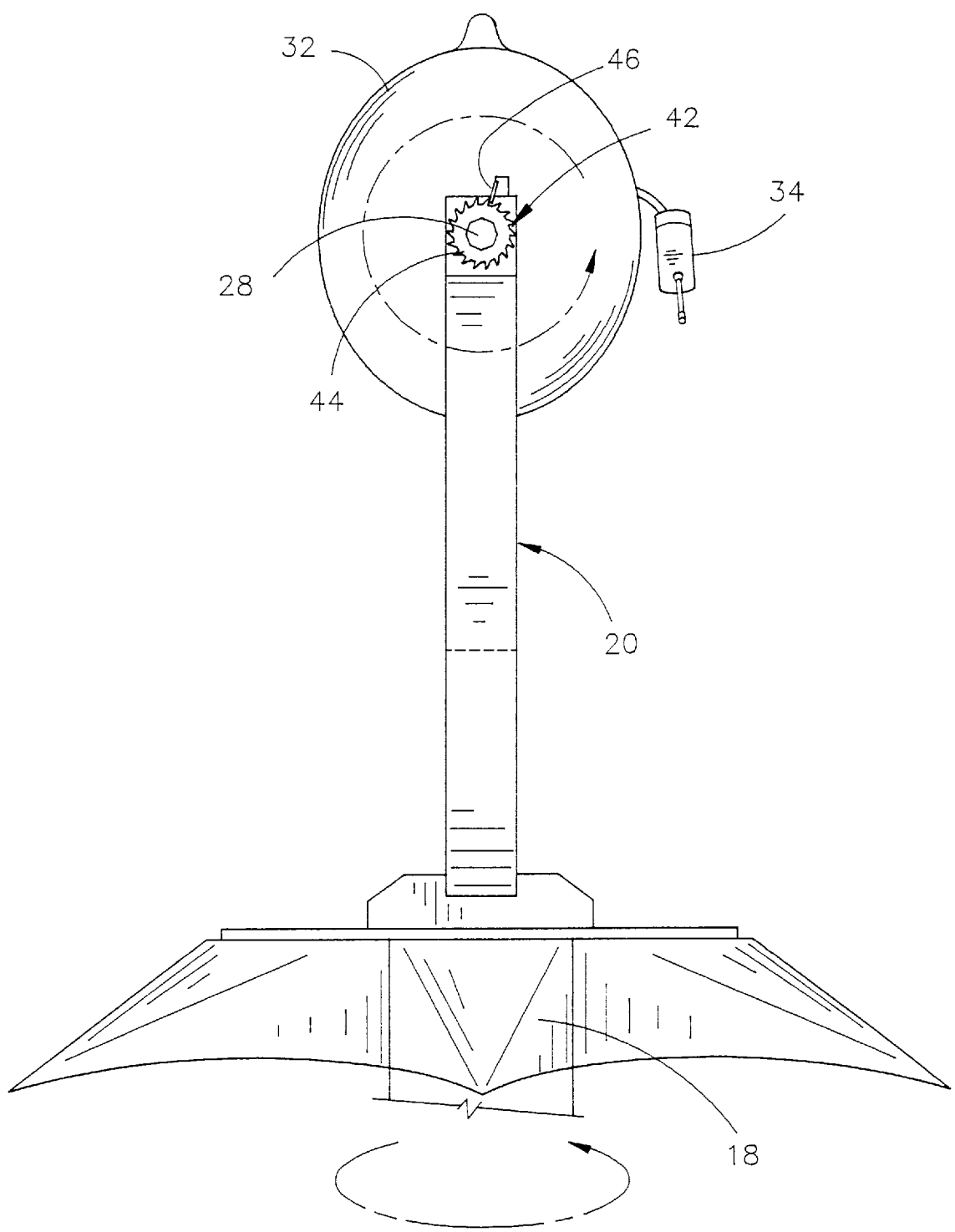
FIG. 2 is an end view of the equipment of FIG. 1.
Figure 5:
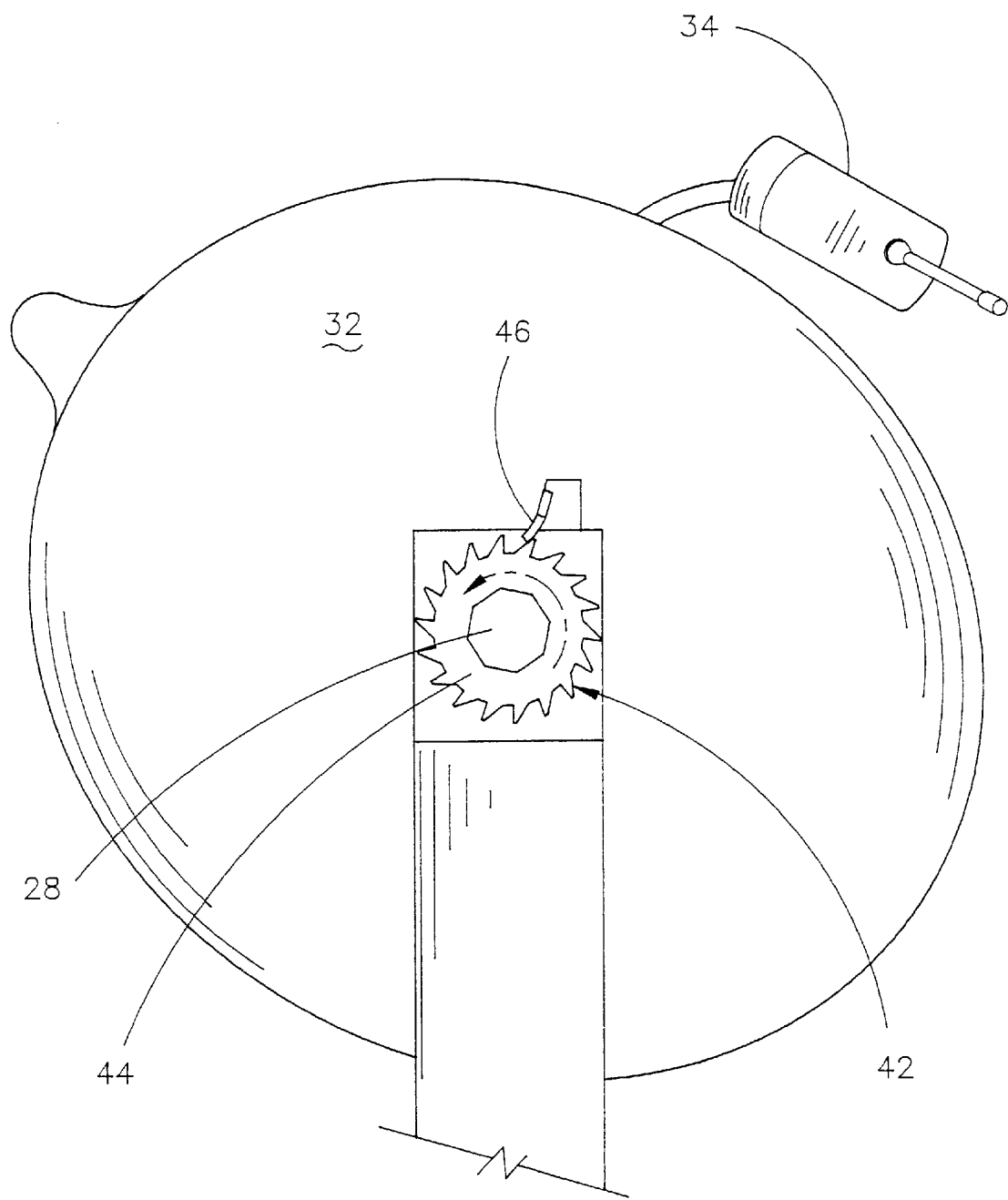
FIG. 5 is an enlarged partial view of FIG. 3.
Figure 6:
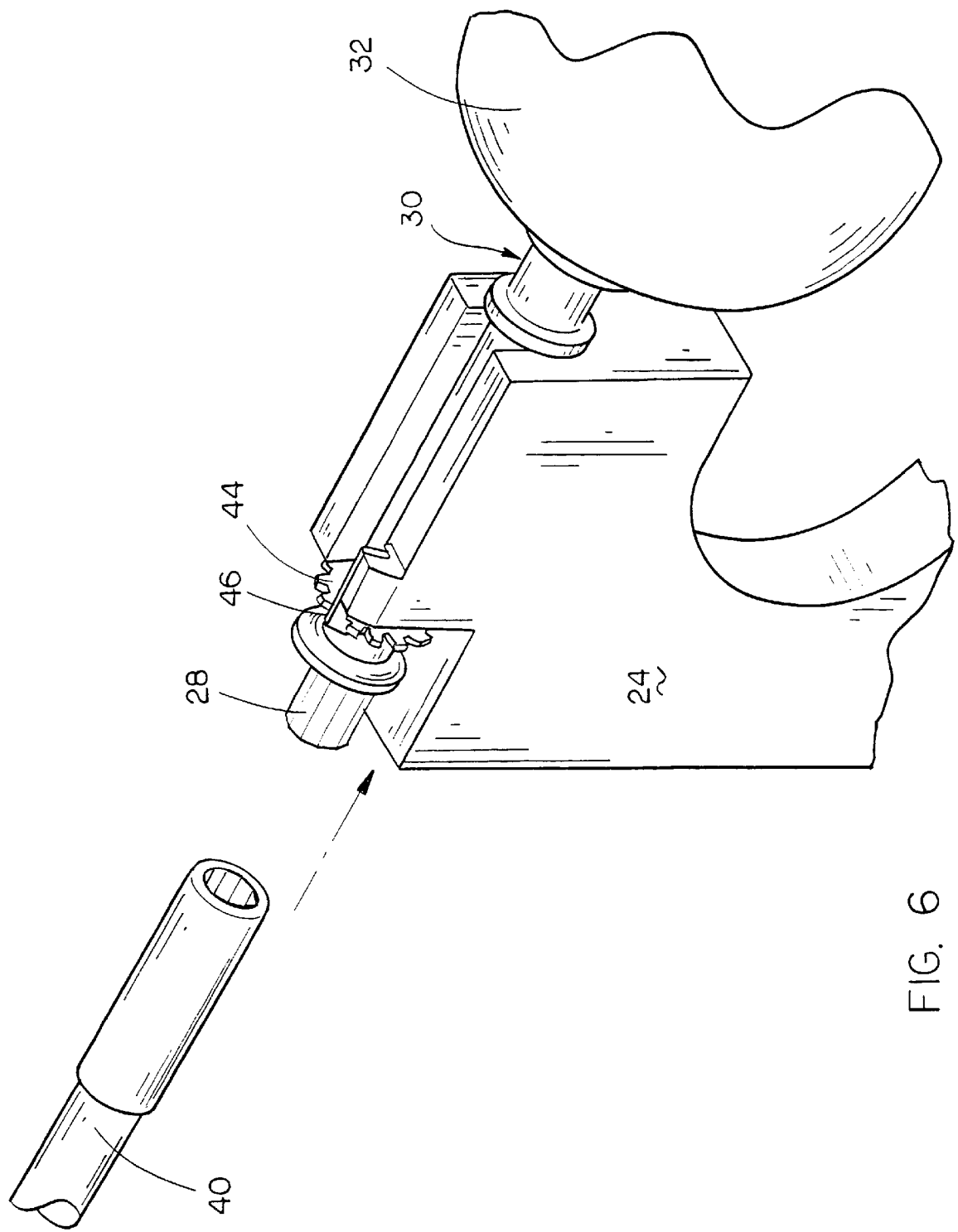
FIG. 6 is a partial perspective view of the positioning means.
Figure 7:
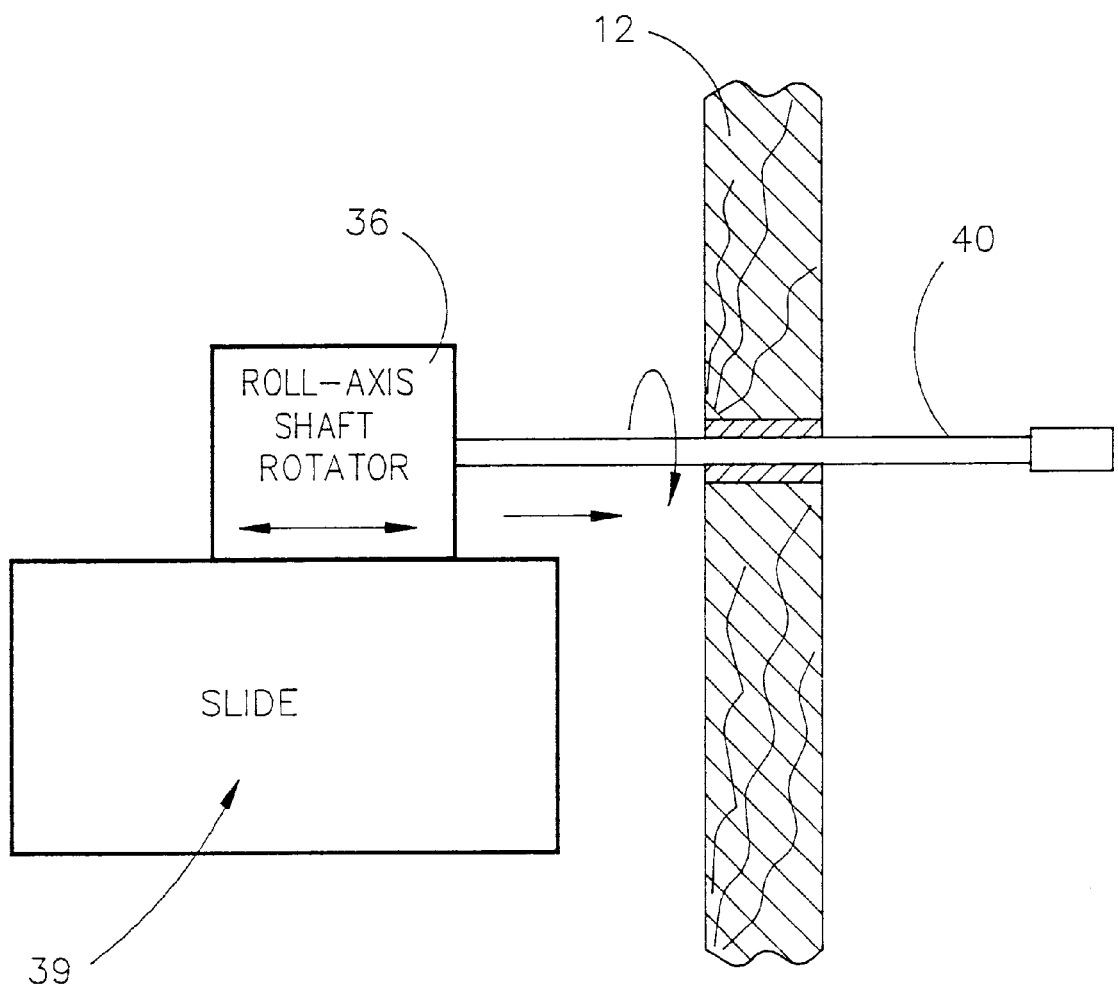
FIG. 7 is a partial perspective view of the connecting rod.

In the drawings, the numeral 10 refers generally to a conventional anechoic chamber including a wall 12 which has an elongated opening 14 extending between the chamber 10 and an area 16 outwardly of the chamber 10. The numeral 18 refers to a conventional azimuth rotator pedestal which is vertically disposed and which is rotatable about a vertical axis in an incremental manner in conventional fashion.

To overcome the problems associated with the prior art methods of measuring the radiation pattern of an antenna, a yoke 20 comprised of a low dielectric material is positioned on the upper end of the azimuth rotator pedestal 18. Yoke 20 includes a base portion 22 and legs 24 and 26 which extend upwardly from base 22 in a spaced-apart manner. Horizontally disposed and rotatable roll-axis shaft portions 28 and 29 are mounted in the upper ends of legs 24 and 26, respectively, and extend therefrom, as seen in the drawings. Shaft portions 28 and 29 are connected to an antenna support 32 in the shape of a head in the manner illustrated in the drawings. For purposes of discussion, shaft portions 28 and 29 will be described as a roll-axis shaft 30. Antenna roll-axis support 32 is adapted to have the antenna under test 34 mounted thereon by rubber bands or the like. Antenna support 32 and roll-axis shaft 30 are comprised of a low dielectric material.

The numeral 36 refers to a conventional roll-axis mechanism including a motor, encoder, position sensors, and control valves which are connected to a horizontally movable pneumatic slide 39 which is adapted to horizontally move the roll-axis mechanism. The numeral 40 refers to a connecting rod which is horizontally disposed and which is operatively connected to the roll-axis mechanism 36. The slide is adapted to move the connecting rod 40 into the chamber 10 so that the inner end of the connecting rod 40 engages the roll-axis shaft 30 to enable the roll-axis 36 to incrementally rotate roll-axis shaft 30 which in turn will cause the rotation of the antenna support 32 and the antenna under test 34.

As seen in the drawings, a ratchet mechanism 42 is mounted on the end of roll-axis shaft portion 28 and which includes a ratchet wheel 44 and pawl 46. As best seen in FIG. 1, the end of shaft portion 28 includes a splined portion for engagement with rod 40.

The apparatus disclosed herein provides a novel technique for measuring the radiation pattern of the antenna along the entire sphere of the antenna under test while causing a minimal amount of distortion. Roll-axis mechanism 36 incrementally rotates the roll-axis shaft 30 between successive rotations of the azimuth positioner 18.

Two unique aspects of the invention are responsible for minimizing the distortion. Instead of placing the roll-axis mechanism atop the azimuth rotator, as is usually the case in the prior art devices, the rotation of the roll-axis is accomplished through the connecting rod 40 that may be inserted through the opening 14 in the back wall 12 of the anechoic chamber 10. The roll-axis mechanism 36 is placed on the slide in such a way that the connecting rod 40 can be moved into the chamber 10, connected to the roll-axis shaft portion 28, rotate the roll-axis shaft 30 incrementally, and withdraw from the chamber. The ratchet mechanism 42 holds the antenna support 32 in position after rod 40 is disconnected from shaft portion 28. The roll-axis mechanism therefore does not cause reflections inside the anechoic chamber while the measurements are collected along the azimuth axis. The other unique aspect of the invention is the use of low dielectric material to support the antenna under test and the roll-axis. The low dielectric material minimizes the distortion usually caused by the antenna under test support and the roll-axis support.

Thus it can be seen that the invention accomplishes at least all of its stated objectives.

We claim:

1. An apparatus for positioning an antenna in an anechoic chamber whereby the radiation pattern of the antenna may be measured, comprising:

a vertically disposed and selectively rotatable azimuth rotator pedestal positioned in the anechoic chamber;

a support mounted on said pedestal for rotation therewith;

said support being comprised of a low dielectric material;

a horizontally disposed and rotatable roll-axis shaft mounted on said support;

an antenna support mounted on said roll-axis shaft for supporting the antenna under test;

a roll-axis shaft rotator positioned outside of the anechoic chamber;

and a horizontally disposed and horizontally movable connecting rod operatively connected to the roll-axis shaft rotator which is selectively horizontally movable in the anechoic chamber for engagement with said roll-axis shaft;

said roll-axis shaft rotator adapted to incrementally rotate said connecting rod, said roll-axis shaft and the antenna under test when said connecting rod is in engagement with said roll-axis shaft.

2. The apparatus of claim 1 wherein said roll-axis shaft is comprised of low dielectric material.

3. The apparatus of claim 1 wherein said support is yoke-shaped.

4. The apparatus of claim 3 wherein said yoke-shaped support comprises a base portion having a pair of spaced-apart legs extending upwardly therefrom.

5. The apparatus of claim 4 wherein said roll-axis shaft is comprised of a low dielectric material.

6. The apparatus of claim 1 further including means to maintain said roll-axis shaft against inadvertent movement.

\* \* \* \* \*